(12) United States Patent
Deng et al.

(10) Patent No.: US 9,620,615 B2
(45) Date of Patent: Apr. 11, 2017

(54) IGBT MANUFACTURING METHOD

(71) Applicant: CSMC TECHNOLOGIES FAB1 CO., LTD., Wuxi New District (CN)

(72) Inventors: Xiaoshe Deng, Wuxi New District (CN); Qiang Rui, Wuxi New District (CN); Shuo Zhang, Wuxi New District (CN); Genyi Wang, Wuxi New District (CN)

(73) Assignee: CSMC TECHNOLOGIES FAB1 CO., LTD., Wuxi New District (CN)

( * ) Notice: Subject to any disclaimer, the term of this patent is extended or adjusted under 35 U.S.C. 154(b) by 0 days.

(21) Appl. No.: 14/902,516

(22) PCT Filed: Jul. 29, 2014

(86) PCT No.: PCT/CN2014/083186
§ 371 (c)(1),
(2) Date: Dec. 31, 2015

(87) PCT Pub. No.: WO2015/014263
PCT Pub. Date: Feb. 5, 2015

(65) Prior Publication Data
US 2016/0380071 A1 Dec. 29, 2016

(30) Foreign Application Priority Data

Jul. 29, 2013 (CN) .......................... 2013 1 0323481

(51) Int. Cl.
*H01L 21/00* (2006.01)
*H01L 29/66* (2006.01)
(Continued)

(52) U.S. Cl.
CPC .. *H01L 29/66333* (2013.01); *H01L 21/26513* (2013.01); *H01L 21/31111* (2013.01); *H01L 29/0611* (2013.01); *H01L 29/7395* (2013.01)

(58) Field of Classification Search
CPC ........... H01L 29/66333; H01L 29/7395; H01L 29/0611; H01L 21/26513; H01L 21/31111
See application file for complete search history.

(56) References Cited

U.S. PATENT DOCUMENTS

| | | | | |
|---|---|---|---|---|
| 6,011,280 A | * | 1/2000 | Fruth | H01L 29/0615 257/137 |
| 6,404,037 B1 | * | 6/2002 | Finney | H01L 29/0619 257/583 |
| 6,696,705 B1 | * | 2/2004 | Barthelmess | H01L 29/0661 257/104 |

FOREIGN PATENT DOCUMENTS

| CN | 101740379 A | 6/2010 |
|---|---|---|
| CN | 101752415 | 6/2010 |

(Continued)

OTHER PUBLICATIONS

English Translation of PCT Search Report for International Application No. PCT/CN2014/083186; mailed on Sep. 28, 2014.
(Continued)

*Primary Examiner* — Richard Booth
(74) *Attorney, Agent, or Firm* — Kagan Binder, PLLC

(57) ABSTRACT

An insulated gate bipolar transistor (IGBT) manufacturing method comprises the following steps: providing a semiconductor substrate of a first conducting type, the semiconductor substrate having a first major surface and a second major surface (100); forming a field-stop layer of a second conducting type on the first major surface of the semiconductor substrate (200); growing an oxide layer on the field-stop layer (300); removing the oxide layer from the field-stop layer (400); forming an epitaxial layer on the field-stop layer from which the oxide layer has been removed; and then manufacturing an IGBT on the epitaxial layer (600). Before regular manufacturing of an IGBT, the surface defects of a substrate material are eliminated as (Continued)

many as possible before epitaxy is formed, and the quality of an epitaxial layer is improved, thereby improving the quality of the whole IGBT.

8 Claims, 6 Drawing Sheets

(51) Int. Cl.
      *H01L 29/739*     (2006.01)
      *H01L 21/265*     (2006.01)
      *H01L 21/311*     (2006.01)
      *H01L 29/06*      (2006.01)

(56) References Cited

FOREIGN PATENT DOCUMENTS

| CN | 101752415 A | 6/2010 |
|---|---|---|
| CN | 102693912 | 9/2012 |
| CN | 102800591 | 11/2012 |
| CN | 102800591 A | 11/2012 |
| JP | S58168237 A | 10/1983 |
| WO | 2015/010606 | 1/2015 |
| WO | 2015/024502 | 2/2015 |
| WO | 2015/027961 | 3/2015 |
| WO | 2015/081866 | 6/2015 |
| WO | 2015/103910 | 7/2015 |

OTHER PUBLICATIONS

Zhong et al., U.S. Appl. No. 14/902,517, International Application Filing Date Jul. 22, 2014.
Zhang et al., U.S. Appl. No. 14/902,519, International Application Filing Date Aug. 19, 2014.
Wang et al., U.S. Appl. No. 14/902,302, International Application Filing Date Sep. 2, 2014.
Zhang et al., U.S. Appl. No. 15/023,049, International Application Filing Date Dec. 3, 2014.
Jing, U.S. Appl. No. 15/023,057, International Application Filing Date Dec. 4, 2014.

* cited by examiner

IGBT MANUFACTURING METHOD

FIELD OF THE INVENTION

The invention relates to an IGBT (Insulated Gate Bipolar Transistor) in the technical field of power semiconductor device, and more particularly, relates to a manufacturing method for FS-IGBT (Field Stop Insulated Gate Bipolar Transistor) via an epitaxy technology.

BACKGROUND OF THE INVENTION

As the rapid development of the integrated circuit, a more exact requirement directed to a quality of the substrate material is required. For a normal low voltage IGBT, especially for FS-IGBT manufactured by an epitaxy technology at about 600 volts, the technology difficult is the consistency of the thickness and the specific resistance. The major reason of a low consistency of the specific resistance is an auto-dope of the boron impurity and arsenic impurity. Auto-dope of the N-type impurities (arsenic or phosphorus) can be eliminated by adopting a low voltage epitaxy technology. However, the silicon wafer grown by the low voltage epitaxy technology has a great temperature gradient which results to a great deal of stacking fault and dislocation, a great stacking fault density and a dislocation density will bring a fatal damage to the electrical parameter and the yield of the device. At the same time, some research data indicate that in a P/P+ epitaxy technology applied to the doped boron, the auto-dope effect is greater in a low voltage condition than that in a normal voltage. Thus, for the normal P-type substrate, because the injection is done before the epitaxy technology and the substrate material has relative more surface defects, results in relative more defects on the epitaxial layer, and the epitaxy quality is poor, causing the product to have performance problems.

In the conventional low voltage IGBT epitaxy field stop technology, the FS region of the IGBT is firstly formed, then the epitaxial layer with a required thickness and a specific resistance is grown on the material. In such manufacturing technology, because the injection is done before the epitaxy technology and the substrate material has relative more surface defects, results in relative more defects on the epitaxial layer, and the epitaxy quality is poor, causing the product to have obvious defects such as performance problems. First, when the reactant gas in the epitaxy technology traverses the substrate surface, it's concentration reduces constantly, because when it traverses the substrate surface, at the same time, it reacts with silicon substrate. Secondly, the growth rate of the silicon epitaxy changes according to a change of the silicon source concentration. When the silicon source concentration is high, the epitaxy growing rate is high. Otherwise, when the silicon source concentration is low, the epitaxy growing rate is low. In addition, the concentration of the dopant changes according to a change of the concentration of the impurities in the epitaxial layer. When the concentration of the dopant increases, the concentration of the impurities in the epitaxial layer increases, the specific resistance of the epitaxy decreases, the break down voltage decreases. Otherwise, when the concentration of the dopant decreases, the concentration of the impurities in the epitaxial layer decreases, the specific resistance of the epitaxy increases, the break down voltage increases (in fact, the reaction rate does not simply depend upon the concentration of the reactant, but in generally situation, we admit such proportional relation). As described above, the silicon source concentration in the reactant gas decreases constantly, and then the growth rate which is proportional to the silicon source concentration also decreases constantly, and then the evenness and the consistency of the thickness and the specific resistance of the epitaxial layer deteriorate. When an epitaxy growth is performed on a relative small size substrate, such epitaxy parameter deterioration caused by the reaction rate can be accepted. However, when the diameter of the substrate becomes greater, because the substrate material has relative more surface defects, causing such difference to be greater which goes beyond the tolerance range in production.

SUMMARY OF THE INVENTION

An object of the part is to summarize some aspects of the embodiments of the invention, and provide a brief introduction of some preferred embodiments. The part, abstract of the description and the title of the invention may be simplified or omitted in order to avoid obscuring the objects of the part, abstract of the description and the title of the invention, and should not limit the scope of the invention.

Therefore, it is necessary to provide an IGBT manufacturing method which can effectively reduce surface defects of the substrate material before epitaxy, and improve a quality of the epitaxial layer.

A method of manufacturing an IGBT (Insulated Gate Bipolar Transistor) includes the following steps: providing a semiconductor substrate with a first conductivity type, the semiconductor substrate having a first major surface and a second major surface; forming a field stop layer with a second conductive layer on the first major surface of the semiconductor substrate; growing an oxide layer on the field stop layer; removing the oxide layer on the field stop layer; forming an epitaxial layer on the filed stop layer when the oxide layer is removed; and manufacturing the IGBT continuously on the epitaxial layer.

According to one embodiment, the semiconductor substrate with a first conductivity type is a P-type substrate material.

According to one embodiment, a thickness of the oxide layer is 100 to 25000 angstrom.

According to one embodiment, the semiconductor substrate having the field stop layer is oxidized in a dry-oxygen of 800° C. to 1100° C., a hydrogen oxygen oxidation or a vapor oxidation environment, to obtain the oxide layer.

According to one embodiment, when the oxide layer is grown on the field stop layer, an oxide layer is simultaneously formed on the second major surface of the semiconductor substrate, the method further includes removing the oxide layer formed on the second major layer of the semiconductor substrate.

According to one embodiment, a wet etching technology or a combination of a wet etching and a dry etching technology is performed to remove the oxide layer on the field layer.

According to one embodiment, the field stop layer is formed on the semiconductor substrate by surface implanting N-type impurities and a high temperature drive-in technology.

According to one embodiment, an implantation dose of the N-type impurities is $5E11/cm^2$ to $1E15/cm^2$, and energy thereof is 30 to 200 KeV.

In the actual low voltage IGBT epitaxy FS technology, the injection and the high temperature process lead to more surface defects on the substrate material, and the substrate material formed on the substrate material has relative more surface defects, and the quality is poor, reducing a performance of the device formed by the epitaxy technology. In order to dress the problem, An IGBT manufacturing method is provided, the method reduces the surface defects of the substrate material as much as possible before regular manufacturing of the IGBT, the quality of the epitaxial layer is improved, and then the quality of the whole IGBT is improved.

DETAILED DESCRIPTION OF THE EMBODIMENTS

Figure 1:
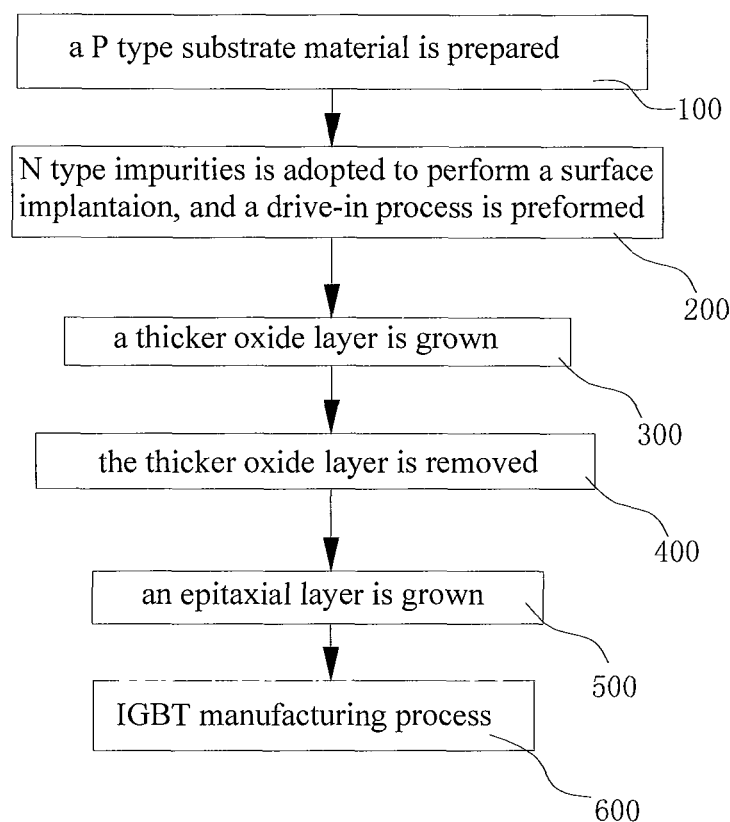
FIG. 1 is a flow chart of an IGBT manufacturing method according to a first embodiment.

For the purpose of better understanding the above objects, features and advantages, embodiments of the present invention will be described in detail hereinafter in conjunction with the drawings.

To facilitate the sufficient understanding of the invention, many details are set forth in the following description. However, the present invention may be implemented in other manners than those described herein, and similar extensions may be made by those skilled in the art without deviating from the spirit of the present invention. Therefore, the present invention is not limited by the embodiments disclosed hereinafter.

Furthermore, the present invention is described in detail in conjunction with simplified cross sectional views. In describing the embodiments of the present invention in detail, for convenient description, sectional views showing structures of the device are not drawn to scale, and these simplified cross sectional views are only examples and should not limit the scope of protection of the present invention. Moreover, three-dimensional size including length, width and depth should be given in view of practical implementation.

As described in the background, in current epitaxy FS technology of IGBT, the epitaxy growth stage includes: first, an initial growth stage, the monocrystalline silicon generated in the gas-stage reaction is deposited on a clean silicon substrate; the quality of the monocrystalline silicon directly influences the defect density of whole epitaxial layer. The better the surface quality, the lower the defect density, otherwise, the defect density is high. In the stage, the silicon source concentration, the dopant concentration, and the reaction rate are in a climbing process. Second, the stable growth process, the process occupies most effective time of silicon epitaxy, most of the thickness required by the epitaxial layer is formed in the state, in such process, the reaction rate and the atmosphere are relatively stable, the deposition rate of the monocrystalline silicon can be controlled. Third, the reaction terminal stage, the transportation of the reactant gas is stopped, the concentrations of the multiple reactant gases in the reaction chamber decrease rapidly, and are in a fall back process. As the advance of the technology, the diameter of the substrate employed to perform an epitaxy process is more and more greater, the diameter of 6 inches substrate is 1.5 times of a diameter of a Φ4" substrate, and an area of 6 inches substrate is 2.25 times of an area of a Φ4" substrate. The diameter of 8 inches substrate is 2 times of a diameter of a 4 inches substrate, and an area of 8 inches substrate is 4 times of an area of a 4 inches substrate. In this situation, because the injection is done before the epitaxy technology and the substrate material has relative more surface defects, results in relative more defects on the epitaxial layer, and the epitaxy quality is poor, causing the product to have performance problems. In this situation, a control of the key parameters of the epitaxial layer such as the specific resistance and a thickness becomes more difficult. In order to clearly illustrate the purpose, technical solution and advantages of the invention, the present is illustrated with reference to accompanying drawings hereinafter.

In one embodiment, a P-type substrate serves as a semiconductor substrate, it relates to a FS-IGBT device manufacturing method, the specific process is shown as FIG. 1.

Before illustrating the embodiment of IGBT manufacturing method, the following illustration is required. As used herein, there are two conductivity types, a first conductivity type and a second conductivity type, respectively. When the first conductivity type is P-type, the second conductivity type is N-type. When the first conductivity type is the N-type, the second conductivity type is P-type. The following takes the P-type as the first conductivity type, takes the N-type as the second conductivity type for example, to illustrate, however, it can not be treated as a limitation. The surface where the emitting electrode and the gate electrode of the IGBT located is normally treated as the first major surface, the surface where the collecting electrode of the IGBT located is normally treated as the second major surface.

In step one 100, in fact, a P-type substrate material is manufactured. In the embodiment, the P-type substrate material is prepared, the thickness of the substrate material has a relation with the epitaxy thickness, the sum of the two is equal to a thickness of a common silicon wafer.

Figure 2:
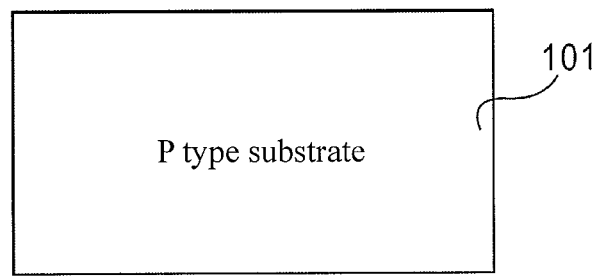
FIGS. 2 through 6 are schematic views of process of the technology method, before manufacturing IGBT according to the first embodiment.

To be specific, the P-type substrate material 101 is the P+ collector region on the back of the IGBT, the specific resistance thereof is selected to be 0.001 to 100 Ω*cm. In the embodiment, a sum of the thickness of substrate material and a thickness of the epitaxy of the P-type substrate material can be 625 μm to 725 μm, as shown in FIG. 2.

Figure 3:
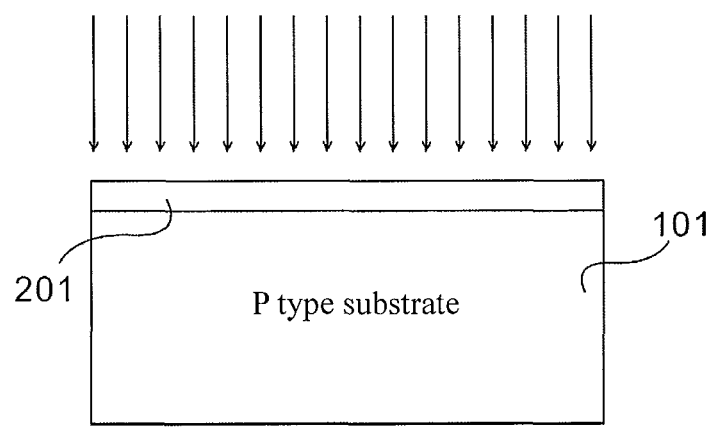

In step two 200, the method adopted to form the field stop layer 201 in the embodiment is as follows, referring to FIG. 3, patterns are photo-etched on the front surface of the substrate, N-type ions are implanted, such as phosphorus, arsenic, antimony, sulfur, or selenium, the implantation dose is $5E11/cm^2$ to $1E15/cm^2$, the energy is 30 KeV to 200 KeV, and a drive-in technology is performed under a high temperature. The temperature and the time are adjusted to allow the N-type impurities to be diffused to a required thickness, and the impurities activation is accomplished at the same time. For example, the annealing temperature is selected to be 1150° C. to 1250° C., the time period is 5 to 20 hours, thus a 15 μm to 30 μm field stop layer 201 is formed.

Figure 4:
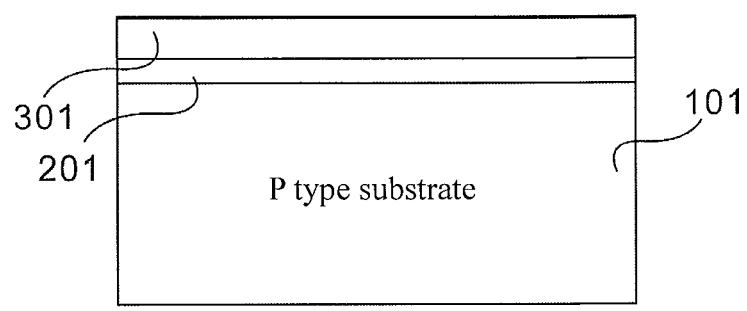

In step three 300, it is placed into a furnace tube to perform a thermal oxide growth, as shown in FIG. 4. Under the condition of 800° C. to 1000° C., a dry-oxygen oxidation technology is adopted and the silicon lateral oxidation is employed to form an oxide layer 301. At the same time, a relative thicker silicon-dioxide layer is formed on the Si—$SiO_2$ interface on the surface of the P-type substrate material 101, the thickness is 100 to 25000 angstrom. The surface of the dry-oxygen growth oxidation film is dry and has a compact structure, and contacts the photo-resist well when performing a photo-etching, it is difficult to produce floating glue, and it facilitates to perform the subsequent procedure.

Figure 5:
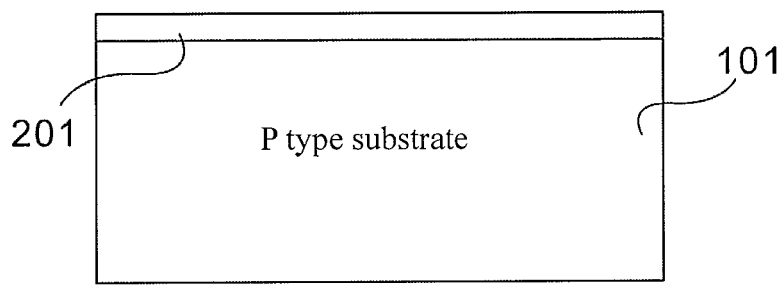

In step four 400, the oxide layer 301, i.e. the silicon dioxide layer, is removed. referring to FIG. 5, the hydrofluoric acid is adopted to remove the oxide layer 301 formed in the step three. By virtue of this step, the residual organic matter, alkaline ions, metallic ions and particles on the surface of the substrate material are removed. In the step, the oxide layer 301 is removed mainly by wet etching technology. It may also adopt other etching technology such as wet and dry alternative etching technology to remove the oxide layer 301. But the oxide layer 301 at the bottom, i.e. on the silicon surface is required to be removed by wet etching technology.

Figure 6:
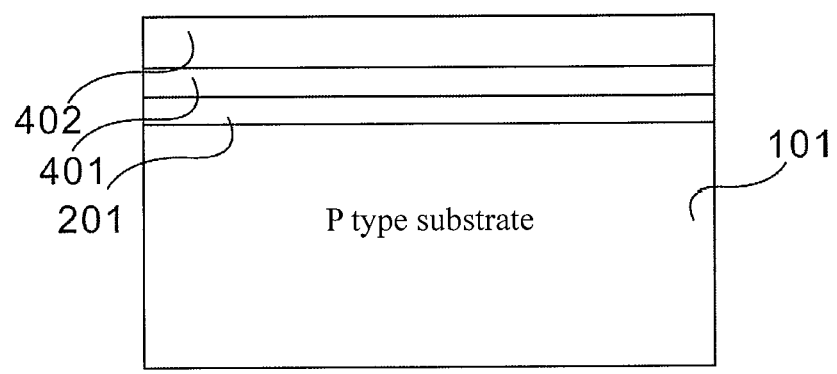

In step five 500, as shown in FIG. 6, a N-type buffer layer 401 is prepared by epitaxy technology. a thickness of the N-type buffer layer 401 is 2 to 40 μm, the specific resistance is 0.05 Ω*cm to 20 Ω*cm. After that, a N-type drift layer 402 is prepared by epitaxy technology, the specific resistance is 5 Ω*cm to 200 Ω*cm, and the thickness is 10 to 150 μm.

When the epitaxy growth technology is completed, the step six 600 is preformed according to a regular process of manufacturing IGBT, which will not specifically described hereinafter.

In the second embodiment, a P-type substrate serves as a semiconductor substrate, it relates to a FS-IGBT device manufacturing method, the specific process is substantially same as that in the first embodiment, the difference is that: when the thermal oxide growth is performed, a wet-oxygen oxidation technology is adopted, in the wet-oxygen oxidation, the oxygen containing vapor substitutes the dry oxygen, the oxidizing agent is a mixture of oxygen and water, the reaction process is as follows: the oxygen passes through a high purity water at 95° C., the oxygen carries the water vapor to an oxidizing furnace, and reacts with the silicon under a high temperature. The wet-oxygen oxidation is equivalent to a combination of dry-oxygen oxidation and a vapor oxidation, the rate thereof falls between the two. The specific oxidation rate depends upon the flux of the oxygen, and the vapor content. The flux of the oxygen is great, and the temperature is high, thus the vapor content is great, and then the growth rate and the quality of the oxidation film are more similar to the vapor oxidation situation. Otherwise, it is similar to a dry-oxygen oxidation.

Specifically in the embodiment, the high purity hydrogen and the oxygen in proportional to the hydrogen are burnt in a silica tube into water, when the ratio of the hydrogen to the oxygen is 2:1, it is vapor oxidation. Such method is adopted, the oxidation rate is fast, and at the same time, heavy metallic impurities such as copper and gold generally in the substrate material can be effectively removed.

In the third embodiment, based upon the first embodiment, after the thicker oxide layer being formed in the step three, the hydrofluoric acid is adopted to remove the oxide layer, then the rinsing process is performed, the containment such as surface particles, alkaline ions, metallic ions are removed. Subsequently, a thicker oxide layer is formed by thermal oxide process again, and then the step four in the first embodiment is preformed, i.e. by virtue of multiple times oxidization and etching technology to clear surface defects of the substrate material.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing an IGBT (Insulated Gate Bipolar Transistor), comprising the following steps:
providing a semiconductor substrate with a first conductivity type, the semiconductor substrate having a first major surface and a second major surface;
forming a field stop layer with a second conductivity type on the first major surface of the semiconductor substrate;
growing an oxide layer on the field stop layer;
removing the oxide layer on the field stop layer;
forming an epitaxial layer on the field stop layer after the oxide layer is removed; and
manufacturing the IGBT continuously on the epitaxial layer.

2. The method according to claim 1, wherein the semiconductor substrate with the first conductivity type is a P-type substrate material.

3. The method according to claim 1, wherein the oxide layer has a thickness ranging from 100 to 25000 angstrom.

4. The method according to claim 1, wherein the semiconductor substrate having the field stop layer is oxidized in a dry-oxygen of 800° C. to 1100° C., a hydrogen oxygen oxidation or a vapor oxidation environment to obtain the oxide layer.

5. The method according to claim 1, wherein when the oxide layer is grown on the field stop layer, an oxide layer is formed simultaneously on the second major surface of the semiconductor substrate, and the method further comprises removing the oxide layer formed on the second major layer of the semiconductor substrate.

6. The method according to claim 1, wherein a wet etching technology or a combination of a wet etching and a dry etching technology is performed to remove the oxide layer on the field layer.

7. The method according to claim 1, wherein the field stop layer is formed on the semiconductor substrate by surface implanting N-type impurities and a high temperature drive-in technology.

8. The method according to claim 7, wherein an implantation dose of the N-type impurities is $5E11/cm^2$ to $1E15/cm^2$, and energy thereof is 30 KeV to 200 KeV.

* * * * *